United States Patent
Chiu et al.

(10) Patent No.: US 9,819,314 B1
(45) Date of Patent: Nov. 14, 2017

(54) METHOD AND CIRCUIT FOR PVT STABILIZATION OF DYNAMIC AMPLIFIERS

(71) Applicant: Board of Regents, The University of Texas System, Austin, TX (US)

(72) Inventors: Yun Chiu, Allen, TX (US); Hai Huang, Richardson, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 15/421,256

(22) Filed: Jan. 31, 2017

(51) Int. Cl.
| | |
|---|---|
| H03M 1/38 | (2006.01) |
| H03F 1/30 | (2006.01) |
| H03M 1/12 | (2006.01) |
| H03M 1/50 | (2006.01) |
| H03M 1/00 | (2006.01) |

(52) U.S. Cl.
CPC ............. *H03F 1/30* (2013.01); *H03M 1/002* (2013.01); *H03M 1/1215* (2013.01); *H03M 1/38* (2013.01); *H03M 1/50* (2013.01)

(58) Field of Classification Search
CPC ....... H03F 1/30; H03M 1/1215; H03M 1/002; H03M 1/50; H03M 1/38; H03M 1/00
USPC .......................................... 341/118, 155, 161
See application file for complete search history.

(56) References Cited

U.S. PATENT DOCUMENTS

| | | | | |
|---|---|---|---|---|
| 7,495,596 B2* | 2/2009 | Kim | ................... | H03M 1/0617 341/118 |
| 7,916,064 B2* | 3/2011 | Lin | ...................... | H03M 1/50 341/155 |
| 8,373,488 B2* | 2/2013 | Zuffada | ............. | H03H 11/0422 327/336 |
| 8,786,483 B1* | 7/2014 | Thompson | .......... | H03M 1/0836 341/120 |
| 9,576,642 B2* | 2/2017 | Thewes | .................. | G11C 7/04 |
| 2008/0055127 A1* | 3/2008 | Kim | ................... | H03M 1/0617 341/118 |
| 2012/0133535 A1* | 5/2012 | Verbruggen | .......... | H03M 1/002 341/110 |
| 2015/0207517 A1* | 7/2015 | Dai | ...................... | H03H 11/481 341/155 |

OTHER PUBLICATIONS

B. Verbruggen, M. Iriguchi, and J. Craninckx, "A 1.7mW 11b 250MS/s 2-Times Interleaved Fully Dynamic Pipelined SAR ADC in 40 nm Digital CMOS," IEEE Journal of Solid-State Circuits, Dec. 2012, pp. 2880-2887, vol. 47, No. 12.

(Continued)

*Primary Examiner* — Jean B Jeanglaude
(74) *Attorney, Agent, or Firm* — Spruce Law Group, LLC

(57) ABSTRACT

A pipelined SAR ADC includes a first stage and passive residue transfer is used to boost a conversion speed. Owing to the passive residue transfer, the first stage may be released during a residue amplification phase, cutting down a large part of the first-stage timing budget. An asynchronous timing scheme may also be adopted in both the first- and second-stage SAR ADCs to maximize the overall conversion speed. Lastly, a dynamic amplifier with proposed PVT stabilization technique may be employed to further save power consumption and improve the conversion speed simultaneously.

20 Claims, 11 Drawing Sheets

(56) References Cited

OTHER PUBLICATIONS

C.Y. Lin and T.C. Lee, "A 12-bit 210-MS/s 5.3-mW Pipelined-SAR ADC with a Passive Residue Transfer Technique", VLSI Circuits Digest of Technical Papers, Jun. 2014, pp. 26-27.

H. Huang, L. Du, and Y. Chiu, "A 1.2-GS/s 8-Bit Two-Step SAR ADC in 65-nm CMOS With Passive Residue Transfer," 2015 IEEE Asian Solid-State Circuits Conference, Nov. 2015, pp. 1-4.

H.Hong, W. Kim, H. Kang, S. Park, M. Choi, H. Park and S. Ryu, "A Decision-Error-Tolerant 45 nm CMOS 7b 1 GS/s Nonbinary 2b/Cycle SAR ADC," IEEE Journal of Solid-State Circuits, Feb. 2015, pp. 543-555, vol. 50, No. 2.

V. Hariprasath, J. Guerber, S.-H. Lee and U.-K. Moon, "Merged Capacitor Switching Based SAR ADC With Highest Switching Energy-Efficiency," Electronics Letters, Apr. 29, 2010, pp. 620-621, vol. 46, No. 9.

\* cited by examiner

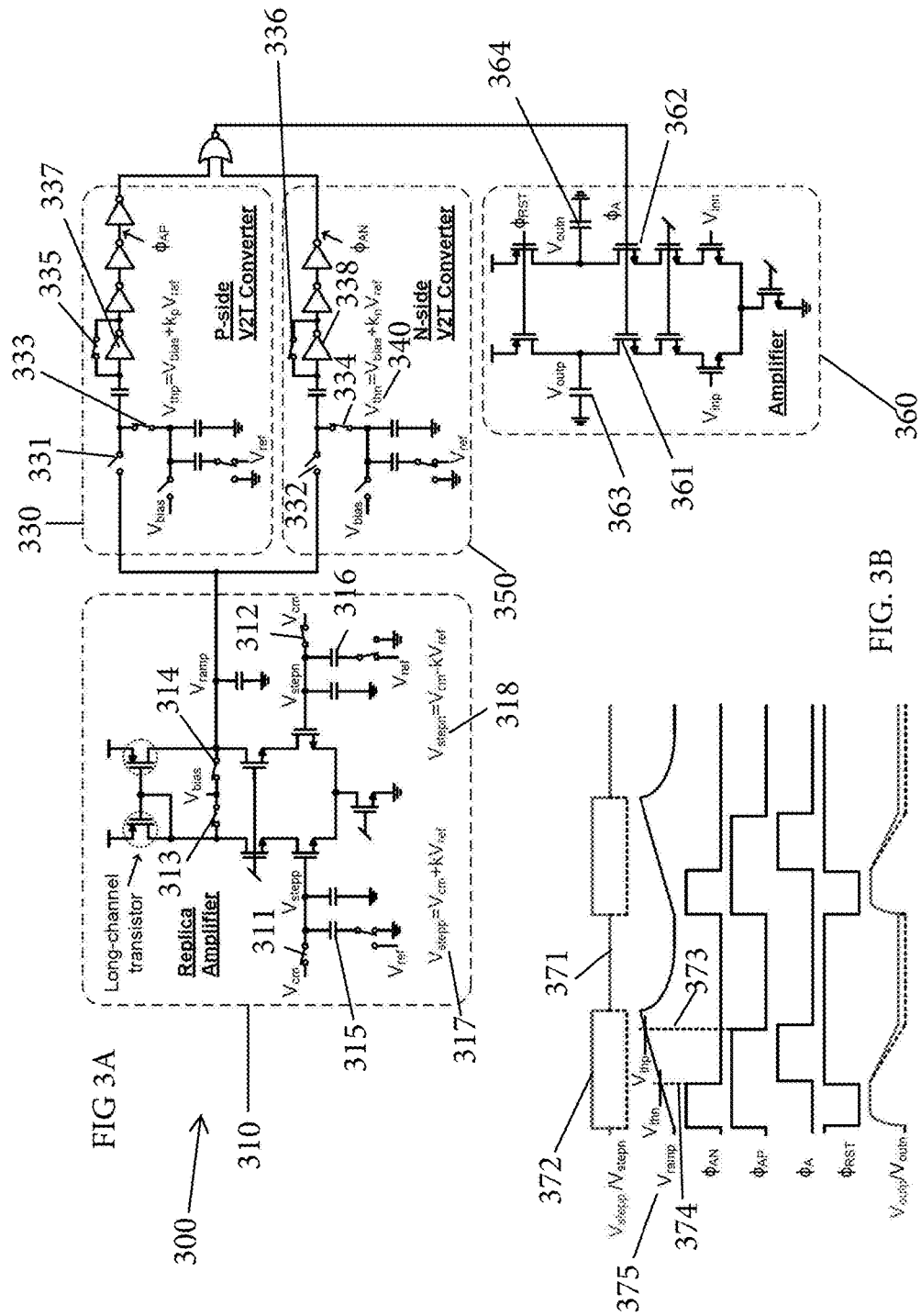

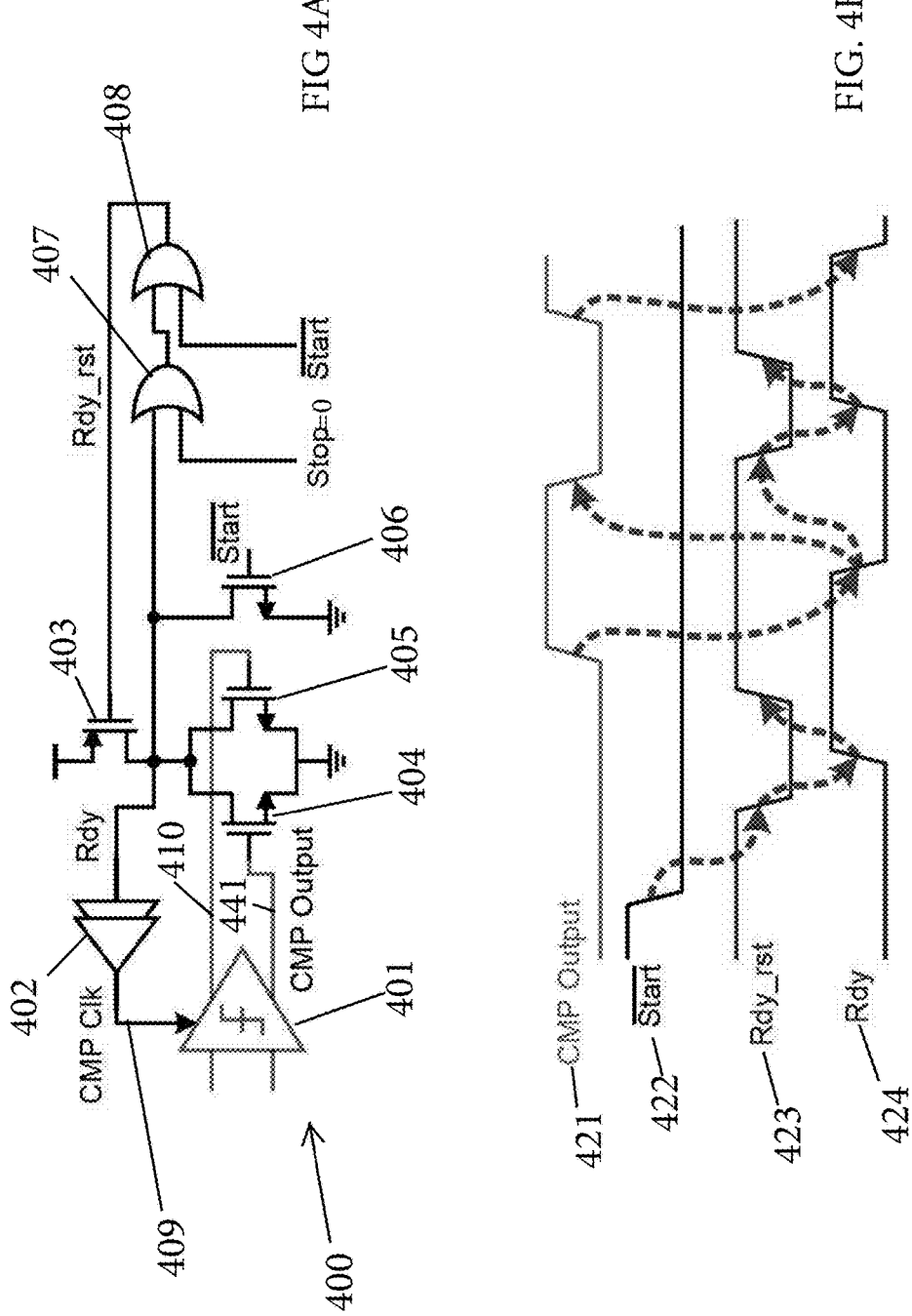

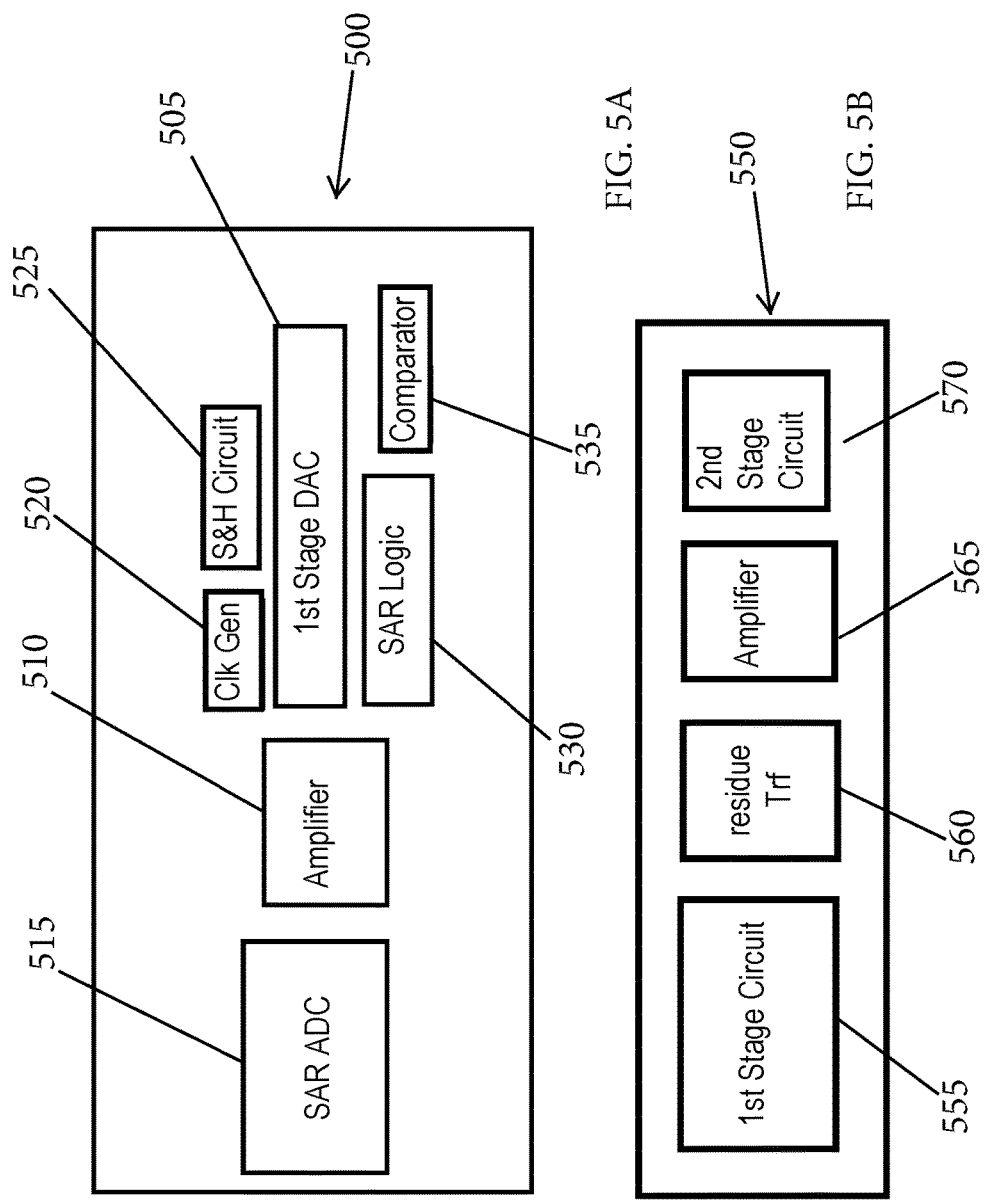

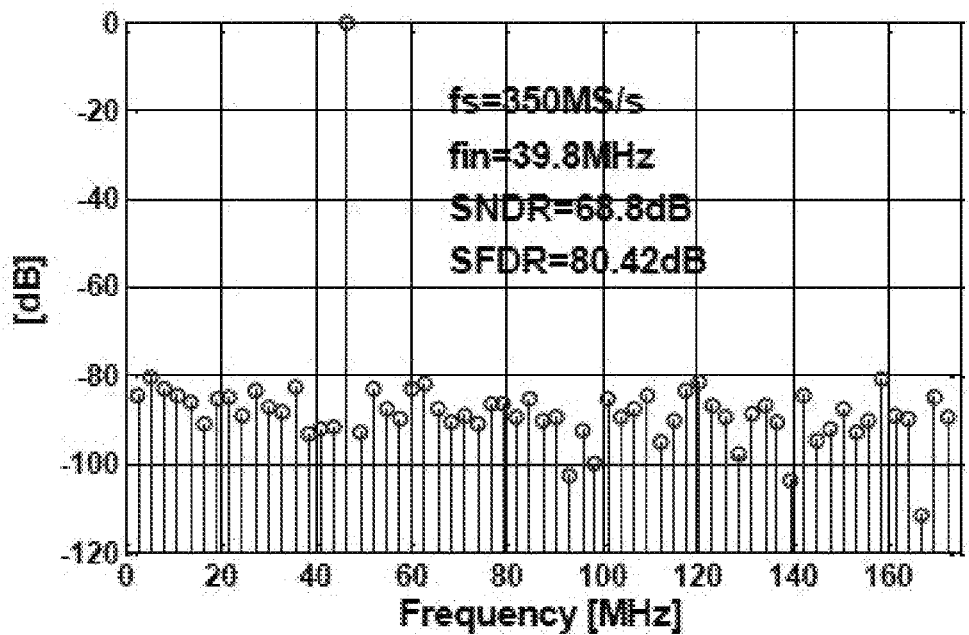
FIG. 6 (a) Fin= 39.8MHz
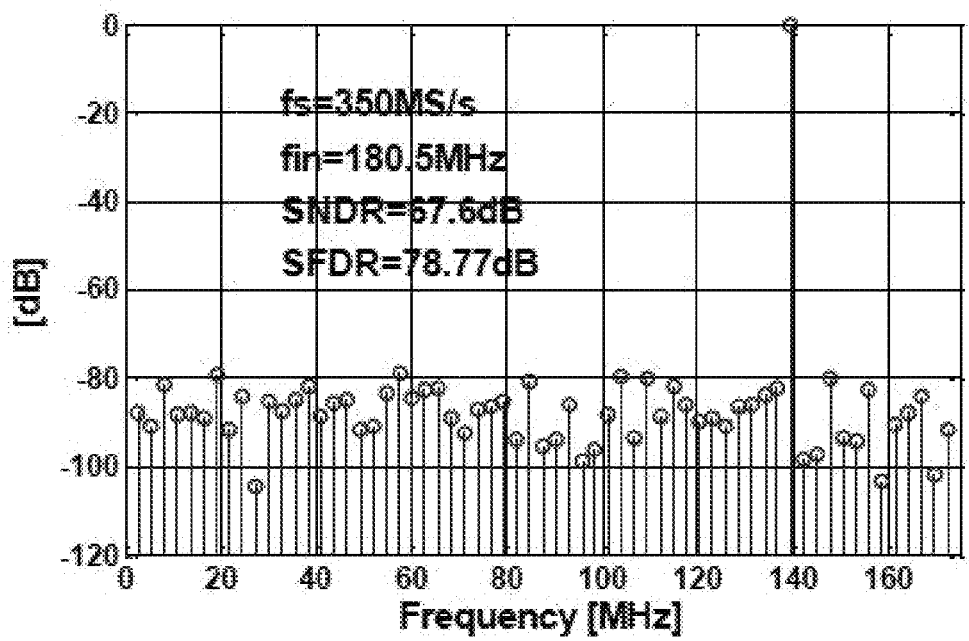
FIG. 6 (b) Fin= 180.5MHz

METHOD AND CIRCUIT FOR PVT STABILIZATION OF DYNAMIC AMPLIFIERS

BACKGROUND

Designers may use successive-approximation-register (SAR) analog-to-digital converters (ADCs) in medium-to-high-resolution applications with sample rates under 1 giga samples per second (GS/s) (according recent research, high-speed SAR ADCs can run at around 1 GS/s). Resolution for SAR ADCs commonly ranges between 8 to 16 bits, and they provide low power consumption and smaller size. This makes ADCs ideal for a variety of applications, such as portable/battery-powered instruments, pen digitizers, industrial controls, and data/signal acquisition.

SAR ADCs may implement a binary search algorithm. Therefore, while the internal circuitry may be running at several gigahertz (GHz), the ADC sample rate is a fraction of that number due to the successive-approximation algorithm.

SUMMARY OF THE EMBODIMENTS

A pipelined SAR ADC includes a first stage and passive residue transfer is used to boost a conversion speed. Owing to the passive residue transfer, the first stage may be released during a residue amplification phase, cutting down a large part of the first-stage timing budget. An asynchronous timing scheme may also be adopted in both the first- and second-stage SAR ADCs to maximize the overall conversion speed. Lastly, a dynamic amplifier with proposed PVT stabilization technique may be employed to further save power consumption and improve the conversion speed simultaneously.

BRIEF DESCRIPTION OF THE DRAWINGS

FIGS. 3A and 3B show a circuit schematic and the operation principle of the proposed dynamic amplifier, along with related timing diagram.

FIGS. 4A and 4B show an asynchronous SAR clock generation circuit with related timing diagram.

FIG. 5A shows a layout floor plan of an ADC core with block details.

FIG. 5B shows a die photo of an ADC chip.

FIGS. 6A and 6B 6 show the post-layout simulated spectrum of the ADC at Fin 39.8 and 180.5 MHz respectively running at 350 MHz (with thermal noise).

DETAILED DESCRIPTION OF THE EMBODIMENTS

1. ADC Architecture

Figure 1A:
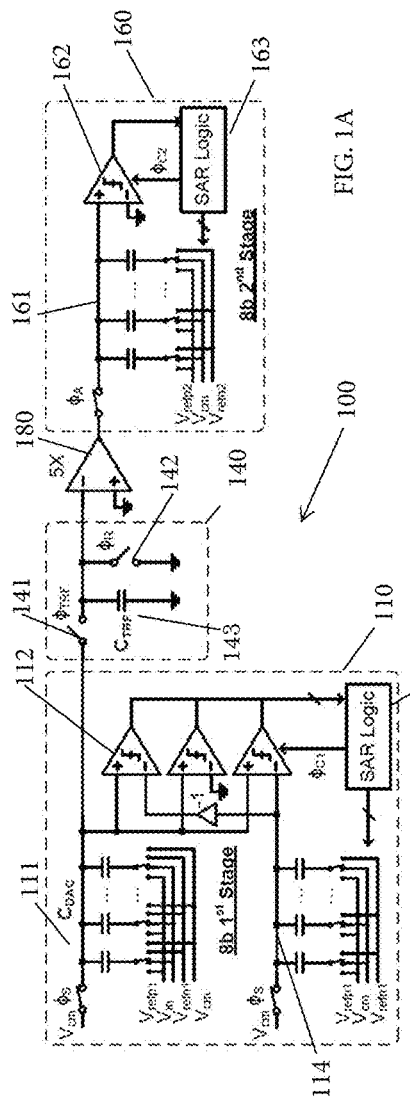
FIGS. 1A-1C show a schematic and timing diagram of the prototype pipelined SAR ADC (single-ended for simplicity) with passive residue transfer.
Figure 1C:
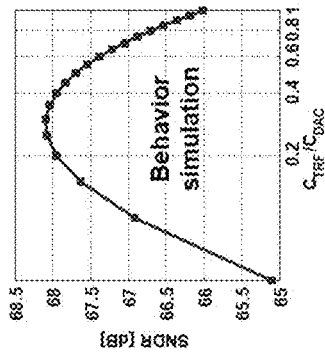

FIG. 1A shows a pipelined SAR ADC schematic 100. In a first 8b stage 110, passive residue transfer is used to boost the conversion speed. For pipelined SAR ADCs, typically the first stage 110 may constitute a speed bottleneck as a significant timing budget is allocated to residue amplification 191 and input sampling 190. Owing to the passive residue transfer, the first stage 110 may be released during a residue amplification phase 191, cutting down a large part of the first-stage 110 timing budget. The SAR ADC schematic 100 may optimize the value of $C_{TRF}$ estimated to be $0.3C_{DAC}$ ($\approx$300 fF) as FIG. 1C, which shows $C_{TRF}/C_{DAC}$ vs. signal-to-noise and distortion ratio (SNDR) shows. To compensate for the SNR penalty caused by the passive residue transfer, the quantization noise may be 13b level.

Besides passive residue transfer, an asynchronous timing scheme may also be adopted in both the first- and second-stage SAR ADCs 110, 160 to maximize the overall conversion speed. The first stage 110 may resolve 8b using a 2b/cycle conversion scheme with 1b built-in redundancy. The second stage 160 resolves also 8b, enabling 2b inter-stage redundancy to absorb any small decision errors in the first stage 110. Both stages may also use a merged capacitor switching scheme, such that the switching power consumption and the potential maximum nonlinearity of both stages can be effectively minimized.

Lastly, a dynamic amplifier 180 with proposed PVT stabilization technique may be employed to further save power consumption and improve the conversion speed simultaneously, which will be described with implementation details below.

The first stage 110 of this ADC 100 comprises a signal digital-to-analogue converter (DAC) 111, a reference DAC 114, three comparators 112 and SAR logics 113. The signal DAC 111 is arranged for sampling the input signal (Vin) and for successive approximations of the sampled input signal. The reference DAC 114 may supply multiple threshold voltages for three comparators 112 involved during the successive approximations of input signal. Three comparators 112 may be arranged to receive the output signals of signal DAC 111 and reference DAC 114 and to make the comparison between plus input and minus input. An SAR logic block 113 may be employed to receive decision results of three comparators 112 and to provide a control signal to control circuitry of the signal DAC 111. Moreover, SAR logics may provide the clock signal to trigger three comparators 112.

A second stage 160 of the ADC 160 includes a signal DAC 161, a comparator 162, and SAR logic 163. The components in the second stage 160 share the same operation principles and implement the same function as these in the first stage 110. The passive residue transfer block 140 comprises a transfer switch 141, a reset switch 142, and a transfer capacitor 143. The transfer capacitor 143, after being reset by the reset switch 142, could be employed to sample the residue voltage generated by the first-stage signal DAC 111.

Figure 1B:
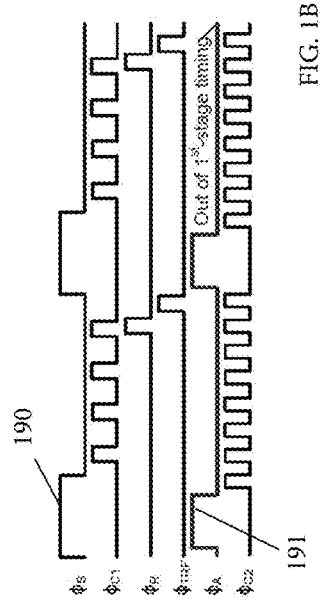

FIG. 1B shows a timing diagram of the prototype pipelined SAR ADC. First, $\Phi_S$ turns high 190 and first-stage signal DAC 111 samples the input while the reference DAC 114 samples the common mode voltage ($V_{cm}$). Then, $\Phi_{C1}$ is brought high, triggering three comparators 112 to make comparisons. After that, $\Phi_{C1}$ is brought low, triggering first-stage signal DAC 111 and reference DAC 114 to update their outputs for implementing successive approximations of the sampled input signal. When $\Phi_R$ turns high, the reset switch 142 turns on and the transfer capacitor 143 is reset. When $\Phi_{TRF}$ turns high, the transfer switch 141 turns on and the transfer capacitor is connected to the first-stage signal DAC 111. After the residue has been transferred to the transfer capacitor 143, $\Phi_{TRF}$ turns low and $\Phi_A$ turns high, activating the dynamic amplifier 180 to amplify the residue voltage hold by the transfer capacitor 143. When $\Phi_A$ turns low, the amplification completes and the output of dynamic amplifier 180 is sampled by the second-stage signal DAC 161. Then, $\Phi_{C2}$ becomes high, triggering the comparator 162 to perform a comparison. After that, $\Phi_{C1}$ is brought low, triggering second-stage signal DAC 161 to update its output for the next comparison.

2. PVT-Stabilized Dynamic Amplifier

Figure 2:
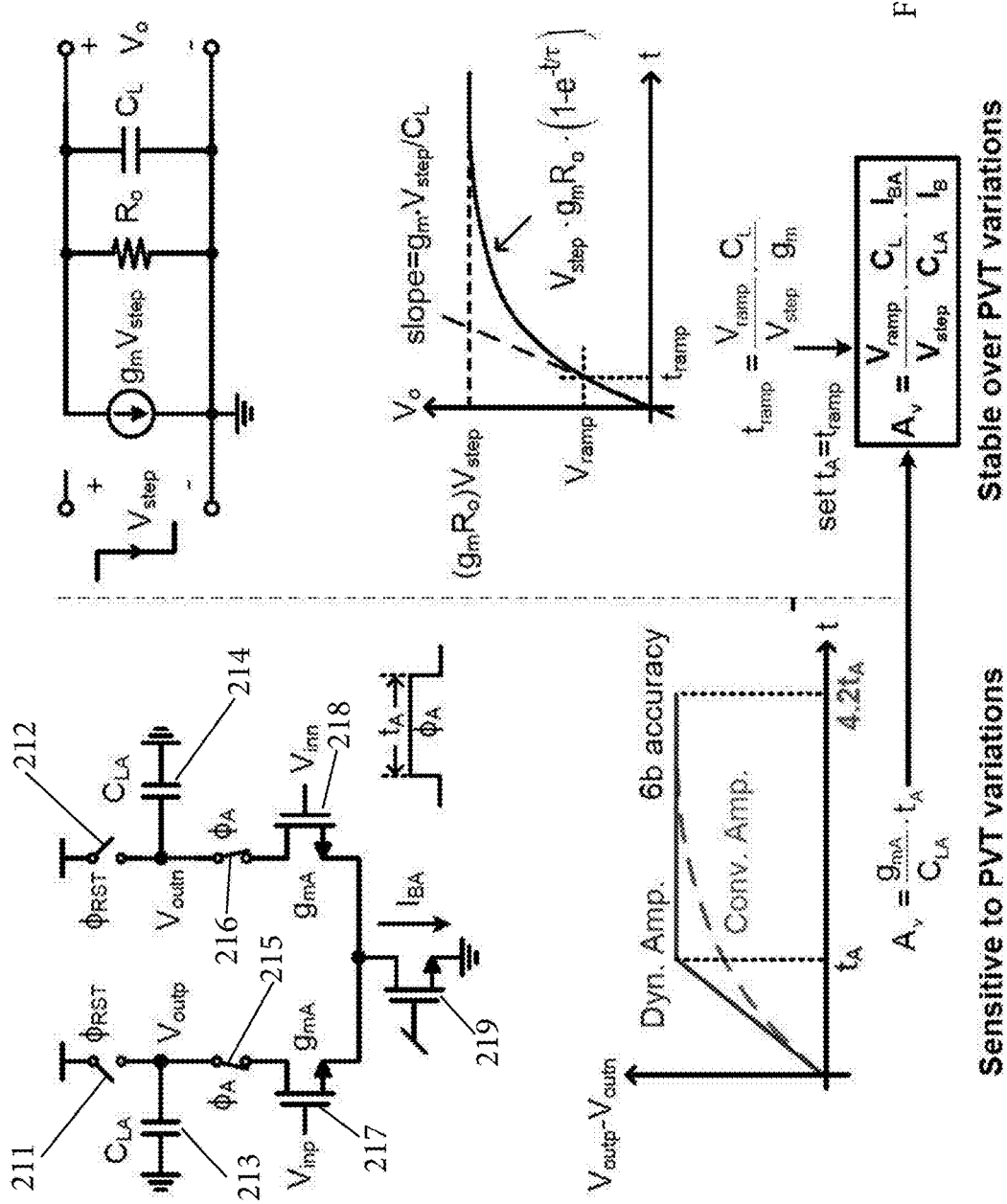
FIG. 2 shows a dynamic amplifier and a proposed process, voltage, and temperature (PVT) stabilization technique, along with related diagrams.

In high-speed pipeline SAR ADCs, conventional opamp-based residue amplifiers consume significant amounts of power due to the stringent settling speed and accuracy requirement. One alternative approach employs the dynamic amplifier 210 to achieve a more efficient form of settling, stemming from the fact that slewing is more power efficient than exponential settling (FIG. 2 lower right). The efficiency of dynamic amplifier 210, however, is also accompanied by a few undesirable features, e.g., ill-defined gain, PVT and clock jitter sensitivity etc. In particular, as the voltage gain of a dynamic amplifier relates to the non-constant transconductance, load capacitance and slewing time ($g_{mA}$, $C_{LA}$ and $t_A$, respectively, in FIG. 2 lower left), it can drift dramatically with PVT variations. The ADC employs an analog approach to effectively stabilize the voltage gain over PVT variations.

Consider the single-pole amplifier 250 shown in FIG. 2 (upper right). When it is driven by a step input $V_{step}$ 252, the beginning part of its settling curve (see t v·$V_o$ graph in FIG. 2 lower right) can be approximated as a ramp with the slope of $g_m \cdot V_{step}/C_L$. Note that the single-pole amplifier, at the beginning of its settling, closely resembles the dynamic amplifier, which exhibits a voltage slope of $g_{mA} \cdot V_{in}/C_{LA}$. The single-pole amplifier 250 may be employed as a replica to set the slewing time $t_A$ of a dynamic amplifier, facilitating a constant voltage gain. In FIG. 2, this gain may be derived as the product of three ratios, $V_{ramp}/V_{step}$, $C_{LA}/C_L$ and $I_{BA}/I_B$. Assuming that $V_{ramp}$ and $V_{step}$ are generated from the same reference voltage (i.e., $V_{ramp}/V_{step}$ remains constant), the gain will remain constant since both the capacitor ratio and current ratio (the transistor size ratio) are stable over PVT variations.

A dynamic amplifier 210 may be made up of reset switches 211 and 212, amplification switches 215 and 216, load capacitors 213 and 214, input transistors 217 and 218, and tail current transistor 219. During a reset phase, when the reset switches 211, 212 turn on, the outputs are reset to the supply voltage. After the reset, amplification switches 215, 216 turn on, and the outputs start to discharge at rates depending on the inputs $V_{inp}$, $V_{inn}$. Finally, once the amplification switches 215, 216 turn off, the amplified outputs $V_{outp}$, $V_{outn}$ are sampled by the load capacitors 213, 214.

FIGS. 3A and 3B depict the circuit implementation and operation principle of a proposed dynamic amplifier 300. As can be seen, the PVT-stabilized dynamic amplifier 300 comprises a replica amplifier 310, a positive-side (P-side) voltage-to-time (V2T) converter 330, a negative-side (N-side) V2T converter 350, and a conventional dynamic amplifier 360. The P-Side V2T Converter and N-Side V2T converter are connected in parallel to the replica amplifier and the P-side V2T converter and N-side V2T converter are connected to the dynamic amplifier through a NOR gate.

The working principle of this proposed dynamic amplifier 300 is described as follows. In the reset phase 371, first, second, third, and fourth switches 311, 312, 313, 314 turn on, and both the input and output of the replica amplifier 310 are reset. Meanwhile, for V2T converters 330, 350, replica input switches 331, 332 are off but voltage input switches 333, 334 (located between Vbias, Vref and inverters 337, 338) and inverter switches, 335, 336 turn on. This configuration makes inverters 337, 338 work in the auto-zeroing mode and sets the threshold voltages of the P-side and N-side V2T converters 330, 350 to $V_{thp}$ 339 and $V_{thn}$ 340, respectively.

Then in the ramping phase 372, switches 311-314 turn off, capacitors 315, 316 are switched to generate step inputs 317, 318 that drive the replica amplifier 310 to ramp 375. Meanwhile, for the V2T converters 330, 350, switches 331, 332 turn on and switches 333-336 turn off. When the ramp signal 375 crosses the threshold voltage of N-side V2T converter (374 in FIG. 3B), the clock $\Phi_{AN}$ will turn low but the clock $\Phi_A$ is brought high. Triggered by the rising edge of $\Phi_A$, first and second transistors 361, 362 turn on and the dynamic amplifier 360 starts to discharge first and second load capacitor 363, 364.

When the ramp signal 375 crosses the threshold voltage of P-side V2T converter (373 in FIG. 3B), both the clock $\Phi_{AP}$ and $\Phi_A$ will turn low. Triggered by the falling edge of clock $\Phi_A$, transistors 361, 362 turn off and the dynamic amplifier 360 stops discharging the load capacitor 363, 364. As might be seen, the pulse width of $\Phi_A$ defines the slewing time of the dynamic amplifier 360.

Any offset voltage of the replica amplifier will modify the exact value of $V_{step}$. In this work, a large $V_{step}$ may be chosen and the impact of offset is largely minimized. Lastly, note that the reference voltage $V_{ref}$ does not need to be set precisely since $V_{ref}$ is cancelled out from the voltage ratio $(V_{thp}-V_{thn})/(V_{stepp}-V_{stepn})$, i.e., $V_{ramp}/V_{step}$ in FIG. 2, which are determined by the terms k, kp and kn set by capacitor ratios.

3. Asynchronous SAR Loop

A difference between a synchronous SAR ADC and an asynchronous SAR ADC as shown in FIG. 4A is the way to generate the comparator clock. In a synchronous SAR ADC, the comparator clock is a high frequency clock from off-chip. In an asynchronous SAR ADC, the comparator clock 409 is generated autonomously (and asynchronously) from its output signals 410 and 411 The asynchronous SAR loop 400 comprises a comparator 401, three discharging transistors 404, 405, 406, a charging transistor 403, two OR gates, and the cascaded clock buffers 402.

During the sampling phase, the Start signal 422 remains high and the discharging transistor 406 is on, which discharges the Rdy signal 424 to ground and sets the comparator clock 409 to be low. The operation of asynchronous SAR loop starts when the Start signal 422 goes low, indicating the end of the sampling phase. After the logic gate delay of two OR gates 407, 408, the Rdy_rst signal 423 is brought to logic low and the charging transistor 403 turns on, charging the Rdy signal to logic high. When the Rdy signal 424 is high, the comparator clock also goes high and the comparator 401 starts making a comparison.

Once the comparison is completed, either of the comparator two outputs (410 or 411) goes high and either of two discharging transistors (405 or 404) switches on, discharging the Rdy signal 424 to ground again. When the Rdy signal 424 is low, the comparator outputs 410, 411 are reset to be logic low, turning off two discharging transistors 404, 405. Triggered by the falling edge of Rdy signal 424, the Rdy_rst signal 423 goes low and the charging transistor 403 turns on, charging the Rdy signal to logic high again. After buffer 402, the comparator clk 409 goes up, which starts the next comparison. The asynchronous clock 409 generated by this circuit has a fixed output low time, which determines the DAC settling time and the comparator reset time. To guarantee a tolerable DAC settling error, a current-starved transistor is embedded in the loop to vary the DAC settling time. The same asynchronous loop is used in both the first and second stage to generate the asynchronous comparator clock 409.

4. Post-Layout Simulation Results

FIG. 5A shows the layout "floor plan" of an ADC core 500 in 65 nm CMOS with block details. The ADC core 500 may occupy an active area of 460 um×160 um, and comprise a first stage DAC 505, amplifier 510, second stage SAR ADC 515, clock generator 520, sample and hold circuit 525, SAR logic 530, and comparator 535.

FIGS. 6A and 6B 6 show the post-layout simulated spectrum of the ADC at Fin 39.8 and 180.5 MHz respectively running at 350 MHz (with thermal noise). A foreground digital calibration is used to correct DAC mismatch and inter-stage gain error. The simulation result in FIG. 6A indicates an 80.4 dB SFDR and a 68.8 dB signal-to-noise-distortion ratio SNDR with a near-DC input frequency. The SNDR of this ADC with near-Nyquist input frequency drops to 67.6 dB because of the impact of clock jitter. Table 1 summarizes the simulated SNDR of the ADC at different process corners.

TABLE 1

Simulated SNDR at different process corners
(Fclk = 350 MHz, Fin = 39.8 MHz)

| | Corner | | | | |
|---|---|---|---|---|---|
| | TT | FS | SF | FF | SS |
| SNDR | 68.8 dB | 68.5 dB | 68.5 dB | 68.6 dB | 68 dB |

The ADC is robust over process variations. The power consumption of the ADC is around 7 mW, leading to a Figure of Merit of 15 fJ/con-step. The post-layout simulation results lead us to believe that a 350 MS/s, 12b SAR ADC with good power efficiency in 65 nm CMOS is feasible.

5. Measurement Results

Figure 7:
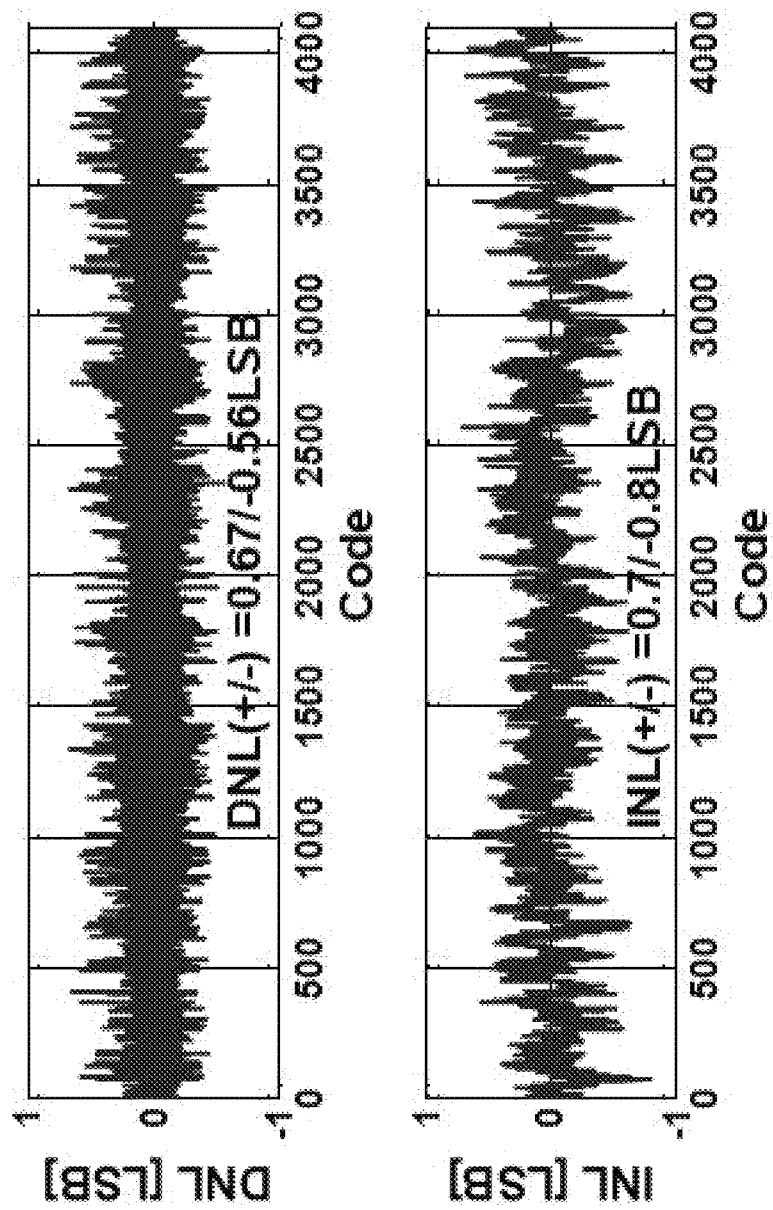
FIG. 7 shows measured DNL and INL profiles.

FIG. 5B shows a die photo of an ADC chip 550 and with an area is 1.5 mm×1 mm, and components comprising: first stage circuit 555, residue Trf 560, amplifier 565, and second stage 570. FIG. 7 shows the measured DNL and INL profiles. The maximum DNL and INL are +0.67/−0.56 LSBs and +0.7/−0.8 LSBs, respectively.

Figure 8:
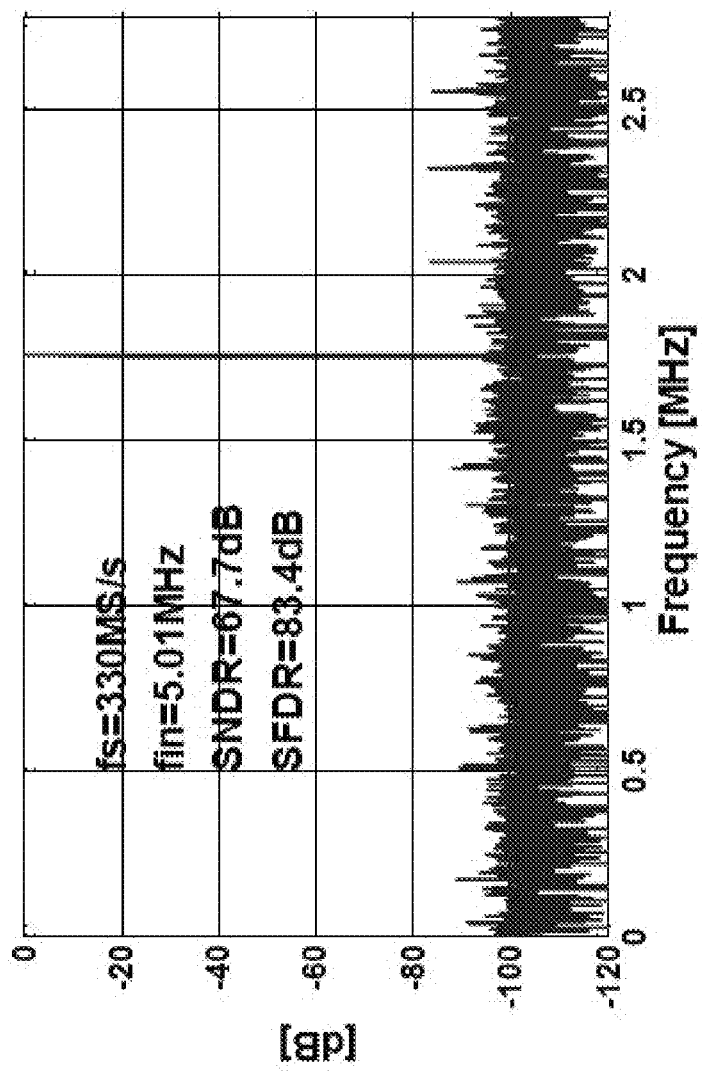
FIGS. 8 and 9 show the dynamic performances of the ADC showing Frequency v. SNDR.
Figure 9:
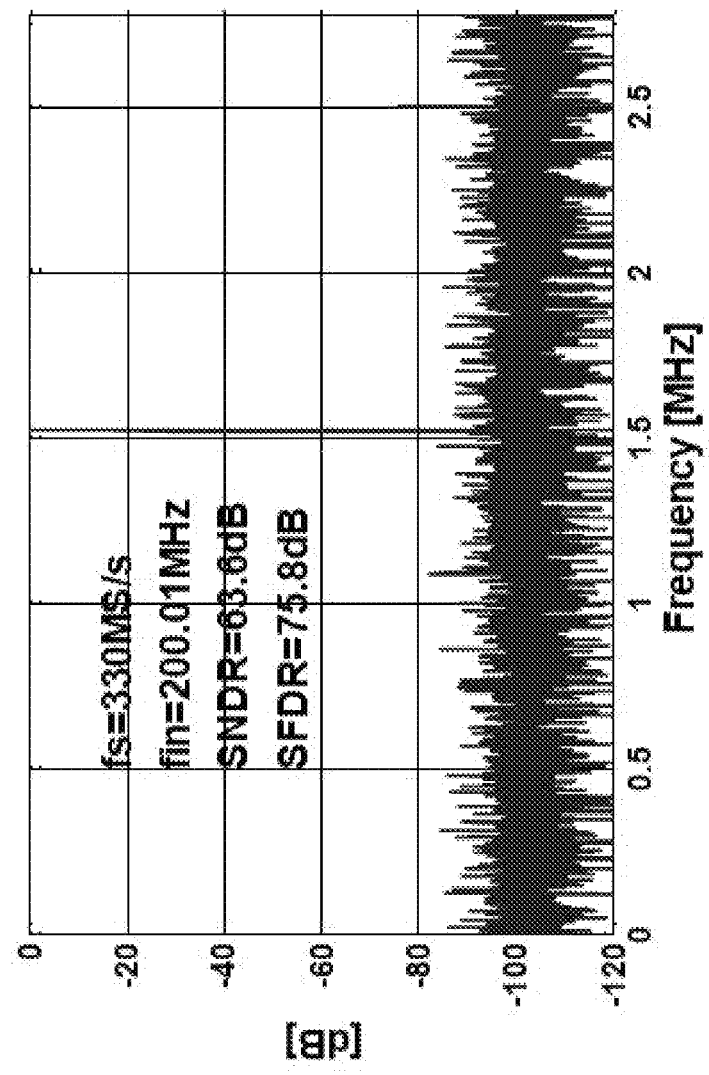
Figure 10:
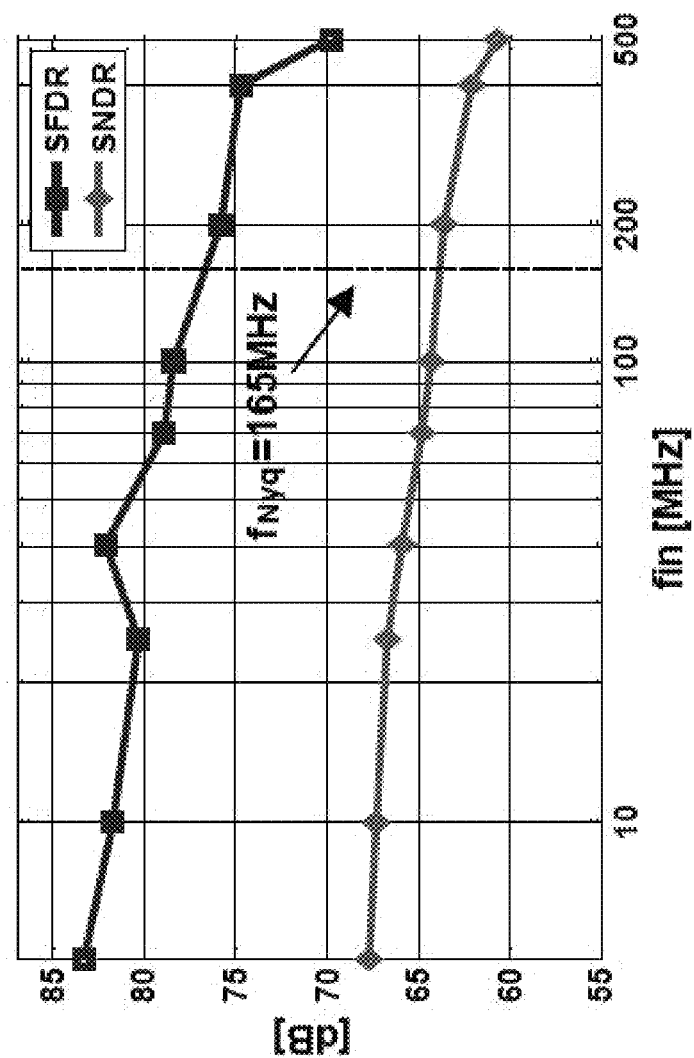
FIG. 10 summarizes the measured dynamic performance vs. the input frequency.

FIGS. 8 and 9 show the dynamic performances of the ADC; the achieved SNDR is 67.7 dB and the SFDR is 83.4 dB for a 5.01 MHz input. For a 200.01 MHz input, the measured SNDR is 63.6 dB and the SFDR is 75.8 dB. The measured power consumption of the ADC running at 330 MS/s is 6.23 mW, leading to a Figure of Merit of 15.4 fJ/con-step. FIG. 10 summarizes the measured dynamic performance vs. the input frequency.

Figure 11:
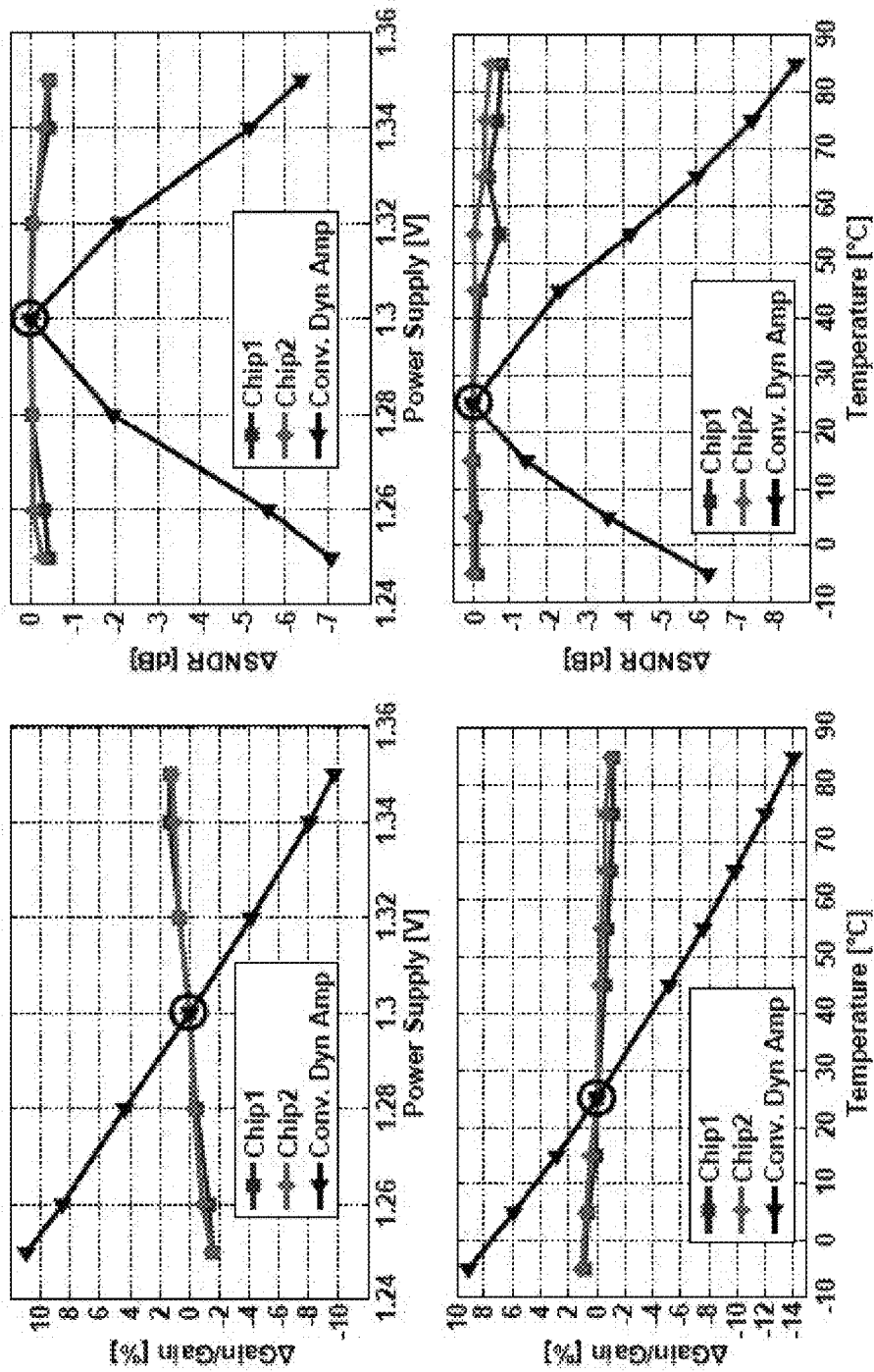
FIG. 11 shows plots that illustrate the measured SNDR and extracted residue gains of the ADC vs. the supply voltage and temperature.

FIG. 11 shows plots that illustrate the measured SNDR and extracted residue gains of the ADC vs. the supply voltage and temperature. For comparison, the simulated gains of the conventional dynamic amplifier and the corresponding SNDR are also plotted in FIG. 11. Over the supply voltage range from 1.25V to 1.35V, the measured gain and SNDR fluctuations are reduced from 11% to 1.5% and from 7 dB to 0.5 dB, respectively. Over the temperature range from −5° C. to 85° C., the measured gain and SNDR deviations are improved from 14% to 1.2% and from 8.6 dB to 0.8 dB, respectively. During the whole experiment, no further calibration was performed. The small residue gain and SNDR fluctuations relative to those of the conventional dynamic amplifier validate the effectiveness of the proposed PVT stabilization technique.

While the invention has been described with reference to the embodiments above, a person of ordinary skill in the art would understand that various changes or modifications may be made thereto without departing from the scope of the claims.

The invention claimed is:

1. A dynamic process, voltage, and temperature (PVT) stabilized dynamic amplifier comprising:
   a replica amplifier;
   a positive-side (P-side) voltage-to-time (V2T) converter;
   a negative-side (N-side) V2T converter; and
   a dynamic amplifier;
   wherein the P-Side V2T Converter and N-Side V2T converter are connected in parallel to the replica amplifier and wherein the P-side V2T converter and N-side V2T converter are connected to the dynamic amplifier through a NOR gate.

2. The dynamic process, voltage, and temperature (PVT) stabilized dynamic amplifier of claim 1, wherein the replica amplifier comprises switches.

3. The dynamic process, voltage, and temperature (PVT) stabilized dynamic amplifier of claim 2, wherein during a reset phase, the switches turn on and both an input and output of the replica amplifier are reset.

4. The dynamic process, voltage, and temperature (PVT) stabilized dynamic amplifier of claim 3, wherein the switches comprise first, second, third, and fourth switches.

5. The dynamic process, voltage, and temperature (PVT) stabilized dynamic amplifier of claim 4, wherein the P-side V2T converter comprises a P-side replica input switch connected in line from the replica amplifier, and the N-side V2T converter comprises an N-side replica input switch connected in line from the replica amplifier.

6. The dynamic process, voltage, and temperature (PVT) stabilized dynamic amplifier of claim 5, wherein the P-side V2T converter comprises a P-side voltage input switch between a $V_{bias}$ and a $V_{ref}$ and a P-side inverter, and the N-side V2T converter comprises an N-side voltage input switch between a $V_{bias}$ and a $V_{ref}$ and an N-side inverter.

7. The dynamic process, voltage, and temperature (PVT) stabilized dynamic amplifier of claim 6, wherein the P-side V2T converter comprises a P-side inverter and P-side inverter switch connected in parallel to a drain of the P-side replica input switch and P-side voltage input switch, and wherein the N-side V2T converter comprises an N-side inverter and N-side inverter switch connected in parallel to a drain of the N-side replica input switch and N-side voltage input switch.

8. The dynamic process, voltage, and temperature (PVT) stabilized dynamic amplifier of claim 7, wherein during the reset phase, the P-side and N-side V2T replica input switches are off but P-Side and N-side voltage input switches and inverter switches turn on.

9. The dynamic process, voltage, and temperature (PVT) stabilized dynamic amplifier of claim 8, wherein during the reset phase, the P-side and N-side inverters work in an auto-zeroing mode and set threshold voltages of the P-side and N-side V2T converters to $V_{thp}$ and $V_{thn}$ respectively.

10. The dynamic process, voltage, and temperature (PVT) stabilized dynamic amplifier of claim 2, wherein the replica amplifier comprises first and second capacitors.

11. The dynamic process, voltage, and temperature (PVT) stabilized dynamic amplifier of claim 10, wherein the switches comprise first, second, third, and fourth switches.

12. The dynamic process, voltage, and temperature (PVT) stabilized dynamic amplifier of claim 11, wherein during a ramping phase, the first, second, third, and fourth switches turn off, and the first and second capacitors generate step inputs that drive a replica amplifier voltage to ramp in a voltage ramp signal.

13. The dynamic process, voltage, and temperature (PVT) stabilized dynamic amplifier of claim 12, wherein during the ramping phase, the N-side and P-side replica input switches turn on and the N-side and P-side voltage input and inverter switches turn off.

14. The dynamic process, voltage, and temperature (PVT) stabilized dynamic amplifier of claim 12, wherein when the voltage ramp signal crosses a threshold voltage of the N-side V2T converter, a clock $\Phi_{AN}$ will turn low but a clock $\Phi_A$ is brought high.

15. The dynamic process, voltage, and temperature (PVT) stabilized dynamic amplifier of claim 14, wherein based on a rising edge of $\Phi_A$, first and second transistors in the dynamic amplifier turn on and the dynamic amplifier starts to discharge first and second load capacitors in the dynamic amplifier.

16. The dynamic process, voltage, and temperature (PVT) stabilized dynamic amplifier of claim 15, wherein when the voltage ramp signal crosses a threshold voltage of P-side V2T converter, both the clock $\Phi_{AP}$ and $\Phi_A$ will turn low.

17. The dynamic process, voltage, and temperature (PVT) stabilized dynamic amplifier of claim 16, wherein triggered by a falling edge of clock $\Phi_A$, the first and second transistors turn off and the dynamic amplifier stops discharging the first and second load capacitors.

18. The stabilized dynamic amplifier of claim 1, wherein the replica amplifier is a single pole amplifier.

19. The stabilized dynamic amplifier of claim 18, wherein the single pole amplifier is driven by a step input voltage Vstep, and sets a slewing time to cause a constant voltage gain through the stabilized dynamic amplifier.

20. The stabilized dynamic amplifier of claim 19, wherein the voltage gain remains constant due to a capacitor ratio and current ratio being stable over PVT variations.

* * * * *